United States Patent [19]

Dhindsa et al.

[11] Patent Number: 5,904,779
[45] Date of Patent: May 18, 1999

[54] WAFER ELECTRICAL DISCHARGE CONTROL BY WAFER LIFTER SYSTEM

[75] Inventors: Rajinder Dhindsa, Milpitas; Steven Franchuk, Fremont; Carlos Manzanilla, San Jose; Ken E. Tokunaga, Fremont, all of Calif.

[73] Assignee: LAM Research Corporation, Fremont, Calif.

[21] Appl. No.: 08/769,433

[22] Filed: Dec. 19, 1996

[51] Int. Cl.⁶ .................................................. C23C 16/00
[52] U.S. Cl. ...................... 118/723 E; 118/728; 118/729; 156/345
[58] Field of Search ................................ 118/723 E, 728, 118/729; 156/345

[56] References Cited

U.S. PATENT DOCUMENTS

| | | | |
|---|---|---|---|
| 5,463,525 | 10/1995 | Barnes et al. | 361/234 |
| 5,467,249 | 11/1995 | Barnes et al. | 361/234 |
| 5,535,507 | 7/1996 | Barnes et al. | 29/825 |
| 5,557,215 | 9/1996 | Saeki et al. | 324/765 |
| 5,561,585 | 10/1996 | Barnes et al. | 361/234 |

FOREIGN PATENT DOCUMENTS

| | | |
|---|---|---|
| 05275517 | 10/1993 | European Pat. Off. . |
| 0 439 000 B1 | 9/1994 | European Pat. Off. . |
| 06338463 | 12/1994 | European Pat. Off. . |
| WO95/24764 | 9/1995 | WIPO . |

*Primary Examiner*—Richard Bueker
*Attorney, Agent, or Firm*—Beyer & Weaver, LLP

[57] ABSTRACT

A substrate lifting arrangement for use in a plasma processing chamber. The plasma processing chamber has a chuck configured for supporting a substrate during processing of the substrate within the plasma processing chamber. The substrate lilting arrangement includes at least one substrate engaging element movable between a first position in which the substrate engaging element does not engage the substrate and a second position in which the substrate engaging element engages the substrate and lifts the substrate off the chuck. The substrate lifting arrangement further includes an actuator coupled to the substrate engaging element. The actuator controls movement of the substrate engaging element between the first and second positions. There is firer included a resistance arrangement coupled to the substrate engaging element. The resistance arrangement limits a current flowing from the substrate to ground through the resistance arrangement. The current is caused by remaining electrical charges on the substrate when the substrate is lifted off the chuck by the substrate engaging element.

14 Claims, 4 Drawing Sheets

WAFER ELECTRICAL DISCHARGE CONTROL BY WAFER LIFTER SYSTEM

BACKGROUND OF THE INVENTION

The present invention relates to the handling of a substrate in the manufacture of an integrated circuit. More particularly, the present invention relates to methods and apparatus for controllably discharging an electrical charge remaining on a substrate in a plasma processing chamber during wafer processing.

Substrates, such as semiconductor substrates or glass substrates, are typically processed using plasma processing chambers to perform various process steps during the manufacture of the resultant devices, e.g., integrated circuits or flat panel displays. These plasma-enhanced semiconductor processes are well known to those skilled in the art. An important aspect of this manufacturing process is the handling of the substrate during its overall processing. Typically the handling and transport of the substrate from one particular process to another is highly automated. As is known, one of the steps that is typically automated is the removing of the substrate from a plasma processing chamber after the processing of the substrate within the chamber.

FIG. 1 illustrates a typical plasma processing system 100 having a plasma processing chamber 102. Chamber 102 includes a base plate 104 and an electrostatic chuck 106 for supporting a substrate 108 during the processing of the substrate. A substrate lifting arrangement 109 includes an actuator 110 and a lifting mechanism 112 having three or more, e.g., four, lifting pins 114. As will be described in more detail below, the various components making up the lifting arrangement 109 are typically electrically conductive and lifting arrangement 109 is typically electrically connected to ground when there is no power to the chuck. Also, electrostatic chuck 106 includes a layer of dielectric material 116 for electrically insulating chuck 106 from substrate 108. Actuator 110 is arranged to move lifting mechanism 112 between a first position in which ling pins 114 do not engage substrate 108 and a second position in which lifting pins 114 engage and lift substrate 108 off chuck 106.

In order to remove the substrate from the plasma processing chamber, the substrate is typically lifted from the chuck using a substrate lifting arrangement such as substrate ling arrangement 109 described above. This allows a substrate transport mechanism (not shown) to grasp the substrate and transport the substrate to the next process step. However, in some cases, the substrate may tend to stick to the chuck. As is known in the art, this sticking problem is caused by an electrical charge which remains on the substrate after the processing of the substrate. If the substrate sticks to the chuck, the substrate may have a tendency to pop loose from the chuck as the lifting arrangement lifts the substrate. This popping off may cause the substrate to be displaced relative to its expected position for grasping by the transport mechanism If the substrate is not in its proper location, the transport mechanism may not be able to properly grasp the substrate and the overall system will have to be stopped so that the displaced substrate can be manually retrieved.

Various approaches have been used to avoid the substrate sticking problem. In a first approach, an additional step is added to the processing of the substrate within the plasma processing chamber. This additional step, referred to as plasma discharging, involves striking a plasma within the chamber which acts as a conductive path for the charge on the substrate to discharge to the wall of the chamber. However, this approach increases the processing time required to process the substrate within the chamber and reduces the throughput of the overall process thereby increasing the overall costs involved with using this approach. Also, this process is typically not able to filly discharge the substrate and therefore does not eliminate the potential for the sticking problem.

In a second approach, the lifting arrangement is electrically conductive and grounded as described above for FIG. 1. With this arrangement, when the lifting arrangement engages the substrate, any charge remaining on the substrate is discharged through the substrate lifting arrangement. Although this approach does not require any additional process steps and elates the sticking problem, in some cases, this approach may cause damage to portions of the substrate. This damage may be caused when relatively high voltage currents are concentrated into small areas of the substrate which are in direct contact with the grounded lifting pins. Although this damage may not occur for substrates having relatively thick oxide layers, as the oxide layers of the substrate get thinner and thinner in order to increase the density of components on the substrate and/or to improve device performance, damage due to these concentrated currents is more likely.

The present invention provides methods and apparatus for controlling the discharge of any electrical charge remaining on a substrate as the substrate is lifted by a lifting arrangement from a chuck. This avoids the sticking problem while also minimizing the chances of damaging the substrate due to high voltage currents concentrated through small areas of the substrate which are in direct contact with the lifting arrangement.

SUMMARY OF THE INVENTION

The invention relates, in one embodiment, to a substrate lifting arrangement for use in a plasma processing chamber. The plasma processing chamber has a chuck configured for supporting a substrate during processing of the substrate within the plasma processing chamber. The substrate lifting arrangement includes at least one substrate engaging element movable between a first position in which the substrate engaging element does not engage the substrate and a second position in which the substrate engaging element engages the substrate and lifts the substrate off the chuck.

The substrate lifting arrangement further includes an actuator coupled to the substrate engaging element. The actuator controls movement of the substrate engaging element between the first and second positions. There is further included a resistance arrangement coupled to the substrate engaging element. The resistance arrangement limits a current flowing from the substrate to ground through the resistance arrangement. The current is caused by remaining electrical charges on the substrate when the substrate is lifted off the chuck by the substrate engaging element.

In another embodiment, the invention relates to a method, in a plasma processing chamber for discharging an electrical charge remaining on the substrate after the processing of the substrate within the processing chamber. The plasma processing chamber has a chuck configured for supporting a substrate during processing of the substrate, and the method includes providing a substrate lifting arrangement. The substrate ling arrangement is configured for lifting the substrate off the chuck.

The method firer includes electrically coupling the substrate lifting arrangement to a resistance arrangement. The method further includes electrically coupling the resistance arrangement to ground, wherein the resistance arrangement is configured to limit a current flow through the substrate lifting arrangement caused by any remaining electrical charge on the substrate as the substrate is lifted off the chuck by the substrate lifting arrangement.

These and other advantages of the present invention will become apparent upon reading the following detailed descriptions and studying the various figures of the drawings.

DETAILED DESCRIPTION OF THE PREFERRED EMBODIMENTS

An invention is described for providing, in a plasma processing chamber, a method and apparatus for controlling the discharge of any electrical charge remaining on a substrate as the substrate is engaged and lifted by a lifting arrangement. In the following description, numerous specific details are set forth in order to provide a thorough understanding of the present invention. It will be obvious, however, to one skilled in the art, that the present invention may be embodied in a wide variety of specific configurations. Also, well known processes have not been described in detail in order not to unnecessarily obscure the present invention.

The inventive substrate discharging technique may be performed in any known plasma processing apparatuses such as, but not limited to, those adapted for dry etching, plasma etching, reactive ion etching, magnetically enhanced reactive ion etching, electron cyclotron resonance, or the like. Note that the this is true irrespective of whether energy to the plasma is delivered through capacitively coupled parallel electrode plates, through ECR microwave plasma sources, or through inductively coupled RF sources such as helicon, helical resonators, and transformer coupled plasma. These processing systems, among others, are readily available commercially.

Figure 1:
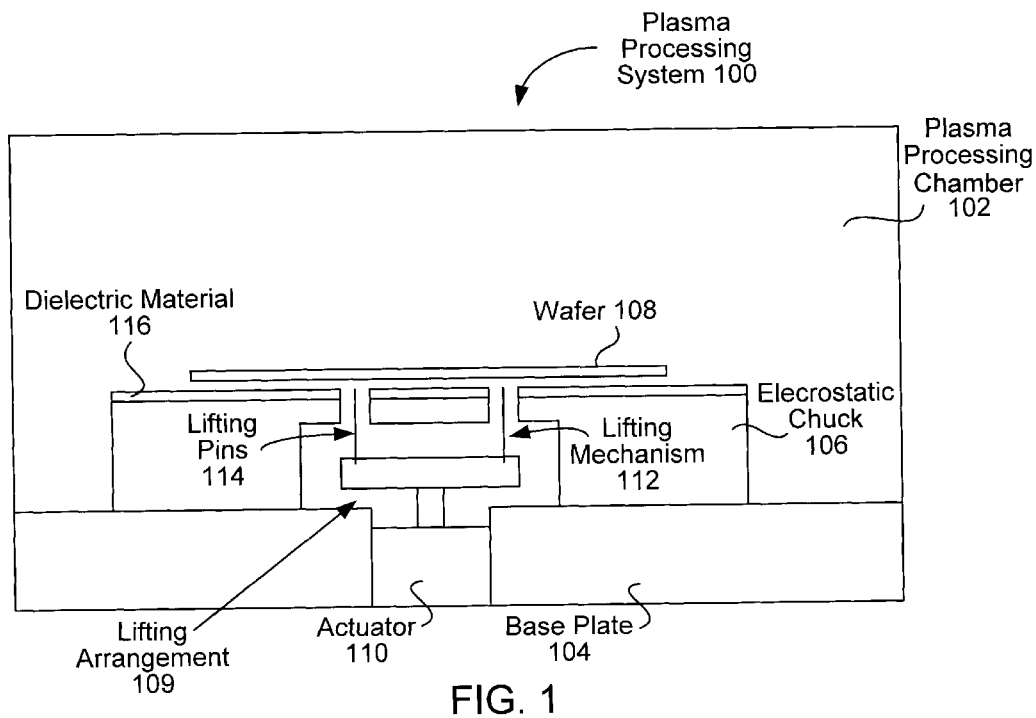
FIG. 1 is a simplified cross-sectional view of a prior art plasma processing chamber including a chuck for supporting a substrate and a four pin substrate lifting arrangement for lifting the substrate after the processing of the substrate within the chamber.
Figure 2A:
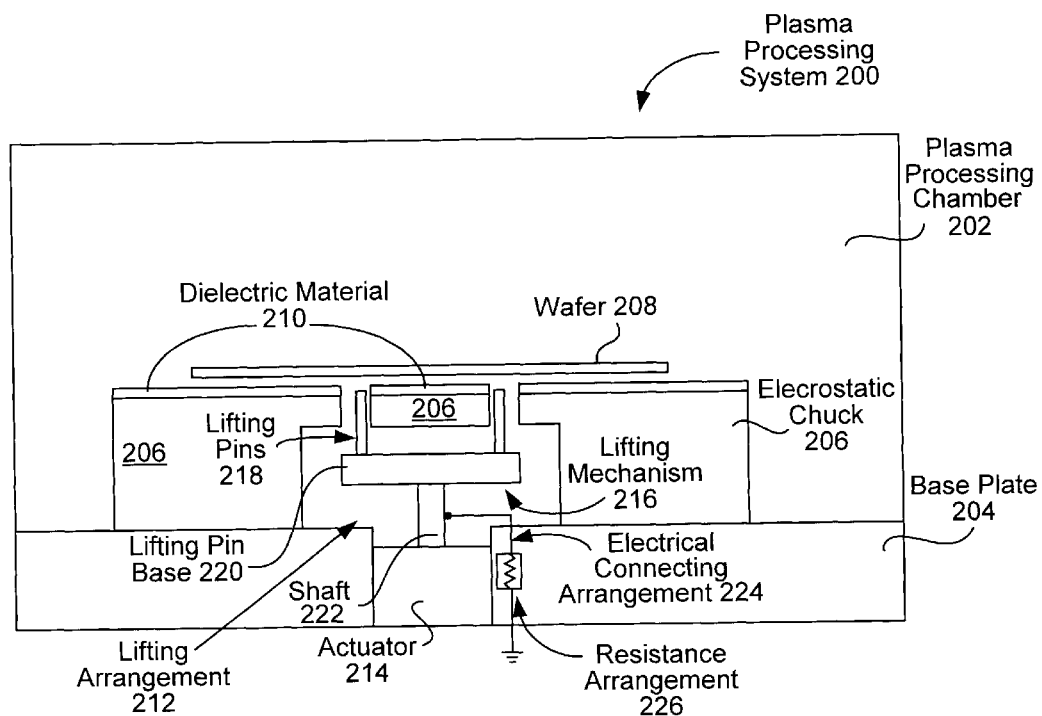
FIG. 2A is an enlarged cross sectional view of a portion of a plasma processing chamber designed in accordance with one embodiment of the invention showing a chuck and a substrate lifting arrangement in accordance with the invention.

FIG. 2A illustrates a simplified schematic of a plasma processing system 200 designed in accordance with the present invention. Generally, system 200 has a plasma processing chamber 202 including a base plate 204 and an electrostatic chuck 206 for supporting a substrate 208 during the processing of the substrate. Electrostatic chuck 206 includes a layer of dielectric material 210 for electrically insulating chuck 206 from substrate 208. In the embodiment shown, a substrate lifting arrangement 212 includes an actuator 214 and a lifting mechanism 216. Lifting mechanism 216 has lifting pins 218, a lifting pin base 220, and a shaft 222. Lifting pins 218 are supported by base 220 which in turn is supported by shaft 222. Actuator 214 is arranged to move lifting mechanism 216 between a first position in which lifting pins 218 do not engage substrate 208 and a second position in which lifting pins 218 extend through chuck 206 and engage and lift substrate 208 off chuck 206. Although lifting arrangement 212 has been described as having a specific configuration, it is to be understood that the lifting arrangement may take on a wide variety of forms so long as it is capable of liking substrate 208 off chuck 206.

In accordance with the invention and as will be described in more detail hereinafter, lifting arrangement 212 includes an electrical connecting arrangement 224 that electrically connects the substrate to ground through a resistance arrangement 226 when lifting arrangement 212 engages and lifts substrate 208 off chuck 206. Resistance arrangement 226 is configured to have a predetermined resistance. With this configuration, any electrical charge that remains on substrate 208 is discharged through electrical connecting arrangement 224 and resistance arrangement 226. Resistance arrangement 226 limits the current flow through electrical connecting arrangement 224 thereby controlling the discharge of any charge remaining on substrate 208.

Because any charge remaining on the substrate is discharged as the substrate lifting arrangement engages and lifts the substrate, the substrate sticking problem described in the background may be avoided. However, in accordance with the invention, by controlling the discharge using resistance arrangement 226, the problem described above in the background of damaging portions of the substrate due to high voltage currents concentrated through small areas of the substrate which are in direct contact with the lifting arrangement may be minimized by proper selection of the resistance for resistance arrangement 226.

Figure 2B:
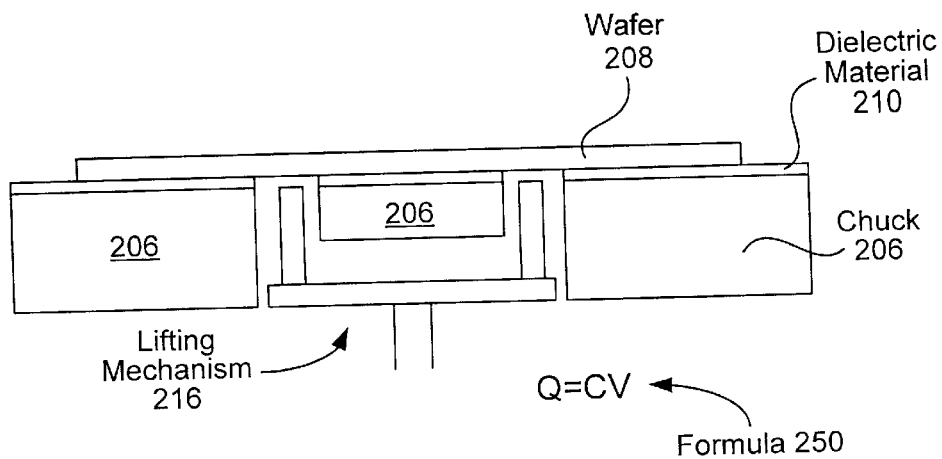
FIG. 2B is a cross sectional view illustrating, in one embodiment, the relative positions of the chuck, substrate, and lifting arrangement of FIG. 2A just before the substrate is lifted by the lifting arrangement.
Figure 2C:
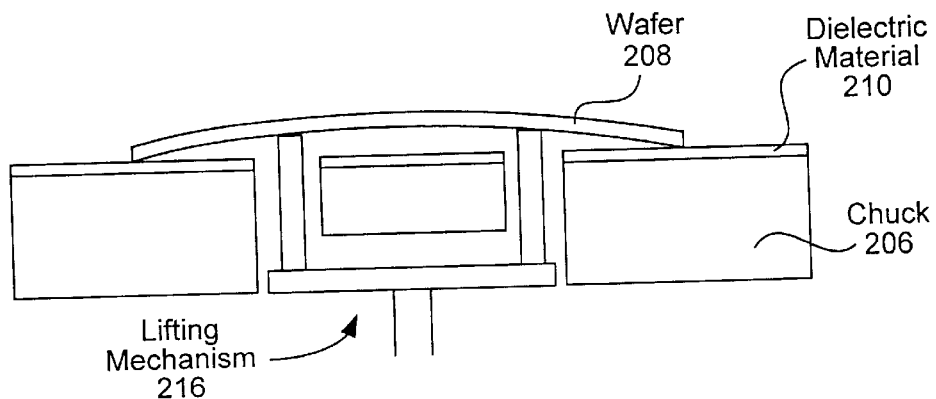
FIG. 2C is a cross sectional view illustrating, in one embodiment, the relative positions of the chuck, substrate, and lifting arrangement of FIG. 2A as the substrate is being to be lifted by the lifting arrangement.
Figure 2D:
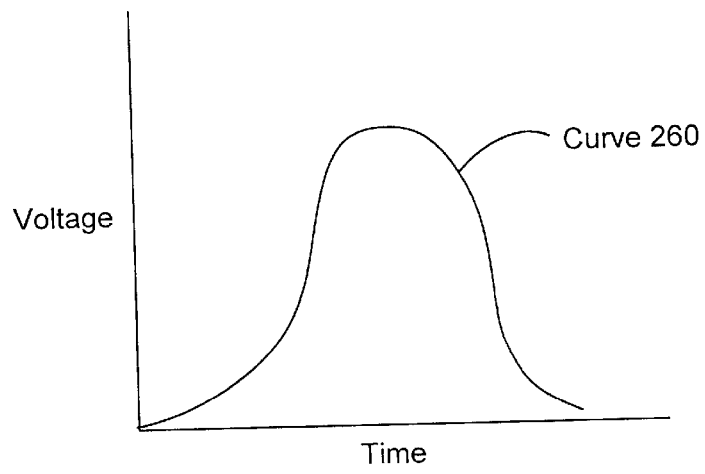
FIG. 2D is a graph illustrating the voltage due to charge on the substrate relative to time for one preferred embodiment of the invention as the substrate is being lifted off the chuck by the substrate lifting arrangement.

In order to avoid the sticking problem, resistance arrangement 226 must be designed to have a resistance low enough that it allows the charge remaining on the substrate to be discharged quickly enough to avoid large sticking forces. However, the resistance must also be kept high enough to limit the current flow enough to minimize the potential for damage to portions of the substrate due to high voltage currents concentrated through small areas of the substrate which are in direct contact with the lifting arrangement. The key factors involved in determining the proper resistance for resistance arrangement 226 will now be described with reference to FIGS. 2B–D. FIGS. 2B and 2C respectively illustrate substrate 208 just before it is to be lifted and as it is beginning to be lifted off chuck 206. FIG. 2D is a graph illustrating the relationship between the voltage due to charge on substrate 208 and time as the substrate is being lifted from chuck 206.

As indicated by formula 250 of FIG. 2B, when there is a charge remaining on substrate 208, the charge (indicated by reference letter Q) on the substrate is equal to the capacitance (indicated by the reference letter C) of substrate 208 relative to chuck 206 and the voltage differential (indicated by the reference letter V) between the substrate and the chuck. The capacitance (C) is proportional to the area and the distance between the substrate and the chuck. As the area between the substrate and the chuck decreases and the distance between the substrate and the chuck increases, the capacitance (C) decreases. Therefore, as the area decreases and the distance increases, the voltage associated with the charge on the substrate increases as required by formula 250.

The sticking force which attracts and holds substrate 208 against chuck 206 is proportional to the square of the voltage (V). As lifting arrangement 212 begins to lift substrate 208 off chuck 206, the area of contact between the substrate and the chuck is decreased and the distance between the substrate and the chuck is increased. This reduces the capacitance (C), and therefore, as required by formula 250 of FIG. 2B, increases the voltage (V) associated with the charge (Q) on the substrate as illustrated by the initial upward portion of curve 260 of FIG. 2D. These voltages may reach voltages as high as 1 KVolt. The increase in the voltage also causes an increase in the sticking force of the substrate to the chuck due to the fact that the sticking force is proportional to the square of the voltage. However, since lifting arrangement 212 also electrically connects the substrate to ground through resistance arrangement 226, the charge (Q) on substrate 208 causes a current to flow through resistance arrangement 226 thereby reducing the charge (Q) on substrate 208 relative to time. The reduction of the charge over time reduces the voltage over time as required by formula 250 of FIG. 2B and as indicated by the downward portion of curve 260 of FIG. 2D.

Because the resistance of resistance arrangement 226 controls how much current flows from the substrate to ground, this resistance determines how long it takes to discharge any charge remaining on substrate 208. As indicated above, the resistance must be kept high enough to limit the current flow enough to minimize the potential for damage to portions of the substrate due to high voltage currents concentrated through small areas of the substrate which are in direct contact with the lifting arrangement. However, the resistance must also be small enough to allow the charge remaining on the substrate to be discharged quickly enough to avoid large sticking forces. It should be noted that the speed at which lifting arrangement 212 lifts substrate 208 off chuck 206 determines the rate of change of the capacitance and therefore the rate of change of the sticking force. For this reason, slowing down the speed at which the lining arrangement lifts the substrate increases the available discharge time, that is, the amount of time available to discharge the charge remaining on substrate 208 and thereby reduce the sticking forces.

As should be understood by those skilled in the art, the above described relationships may be used to determine a wide variety of useful desired resistances for resistance arrangement 226 depending on the charge (Q) that remains on the substrate after processing of the substrate within the chamber and depending on the speed at which the substrate is liked by ling arrangement 212. Because of the multiple variables involved (i.e. charge, lifting speed, and resistance), a wide variety of solutions are available. However, for a given charge and a given lifting speed, one skilled in the art may easily determine a useful resistance in view of the above description.

In a specific example, a resistance of 10 M$\Omega$ was used for resistance arrangement 226. A conventional actuator was used to move lifting arrangement 212 in order to lift the substrate off the chuck. The discharge time associated with this configuration was measured to be approximately $\frac{1}{10}^{th}$ of a second.

Figure 3:
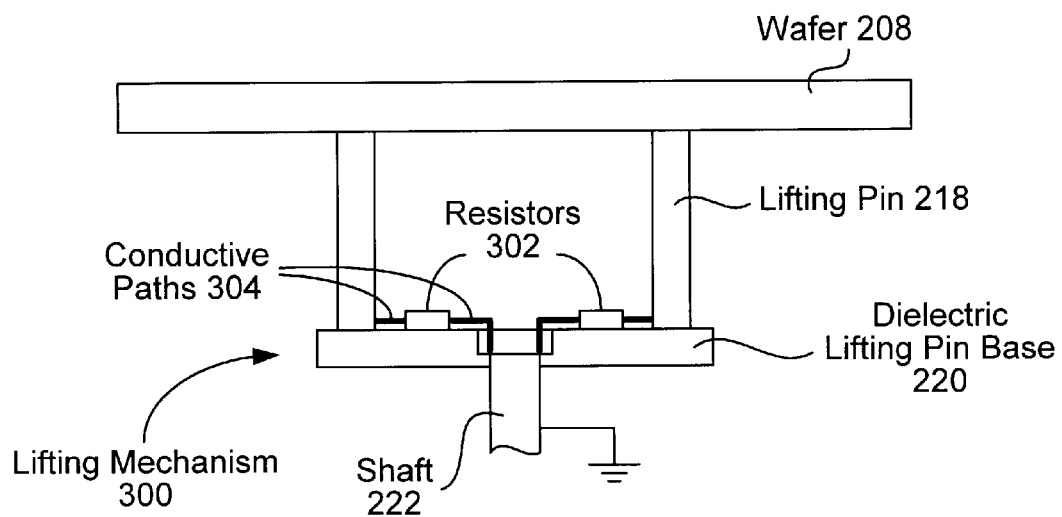
FIG. 3 illustrates a cross-sectional view of a first specific embodiment of the substrate lifting arrangement of FIG. 2A.

Now that the general principles involved with the present invention have been described, four specific embodiments of the resistance arrangement will be described in detail. Although only four specific embodiments will be described, it should be understood that the invention may take on a wide variety of specific configurations and still remain within the scope of the invention. In fact, the invention would equally apply to any configuration which electrically connects a substrate to ground through a predetermined resistance arrangement as the substrate is lifted off a chuck of a plasma processing system Referring now to FIG. 3, a first specific configuration for a lifting mechanism 300 will be described. As mentioned above for lifting mechanism 216 of FIG. 2A, lifting mechanism 300 has four lifting pins 218 (two of which are shown in FIG. 3), a lifting pin base 220, and a shaft 222. Lifting pins 218 are supported by base 220 which in turn is supported by shaft 222. As also described above for FIG. 2A, an actuator 214 is arranged to move lifting mechanism 216 between a first position in which lifting pins 218 do not engage substrate 208 and a second position in which lifting pins 218 engage and lift substrate 208 as illustrated in FIG. 3.

In this specific embodiment, lifting pins 218 and shaft 222 are electrically conductive and shaft 222 is electrically connected to ground. Lifting pin base 220 is made from a dielectric material such that it does not electrically connect lifting pins 218 to shaft 222. For this embodiment, resistance arrangement 226 of FIG. 2A takes the form of four component resistors 302 (two of which are shown in FIG. 3) having a predetermined resistance. Each component resistor 302 is supported by dielectric lifting pin base 220 and electrically connected using conductive paths 304 between an associated one of lifting pins 218 and electrically conductive shaft 222. With this configuration, the combination of lifting pins 218, the component resistors 302, the conductive paths 304, and shaft 222 act as the electrical connecting arrangement 224 of FIG. 2A.

Figure 4:
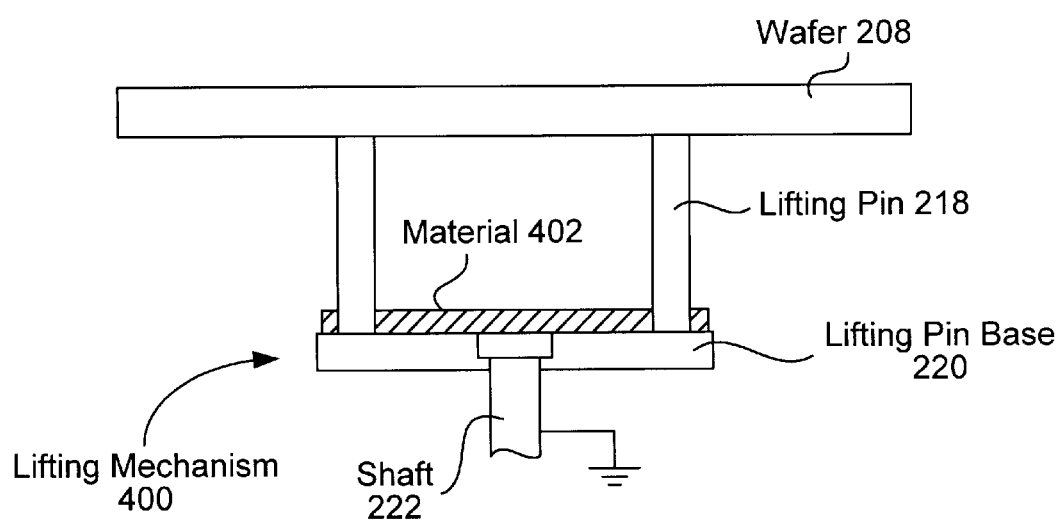
FIG. 4 illustrates a cross-sectional view of a second specific embodiment of the substrate lifting arrangement of FIG. 2A.

FIG. 4 illustrates a second specific embodiment of a lifting mechanism 400 similar to the embodiment shown in FIG. 3. The only difference between the lifting mechanism 300 and lifting mechanism 400 is that the component resistors 302 and the conductive paths 304 of lifting mechanism 300 are replaced in mechanism 400 by a layer of material 402 having a predetermined resistance. This layer of material 402 is supported by lifting pin base 220 such that it electrically connects electrically conductive lifting pins 218 to electrically conductive shaft 222. Since shaft 222 is connected to ground as described above, lifting pins 218, resistance layer 402, and shaft 222 act as the electrical connecting arrangement 224 of FIG. 2A.

Figure 5:
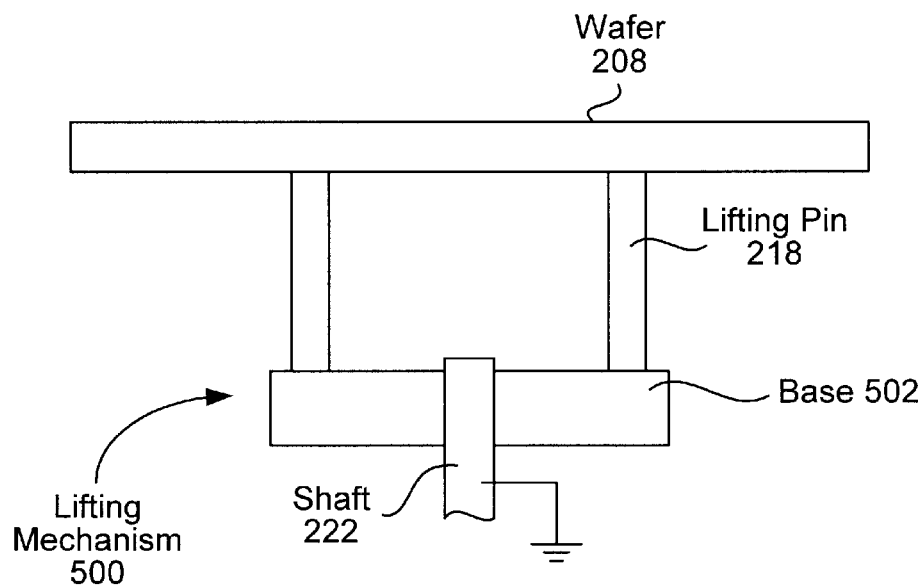
FIG. 5 illustrates a cross-sectional view of a third specific embodiment of the substrate lifting arrangement of FIG. 2A.

FIG. 5 illustrates a third specific embodiment of a lifting mechanism 500 similar to the two described immediately above. However, in this embodiment a lifting pin base 502, which is made of a material having a predetermined electrical resistance, is used instead of lifting pin base 220. Since lifting pin base 502 is made from a material having a predetermined resistance, it electrically connects electrically conductive lifting pins 218 to electrically conductive shaft 222. This eliminates the need for either resistors 302 of FIG.

3 or material 402 of FIG. 4. Instead, lifting pin base 502 acts as the resistance arrangement 226 of FIG. 2A. With this configuration, lifting pins 218, lifting pin base 502, and shaft 222 act as electrical connecting arrangement 224 of FIG. 2A.

Figure 6:
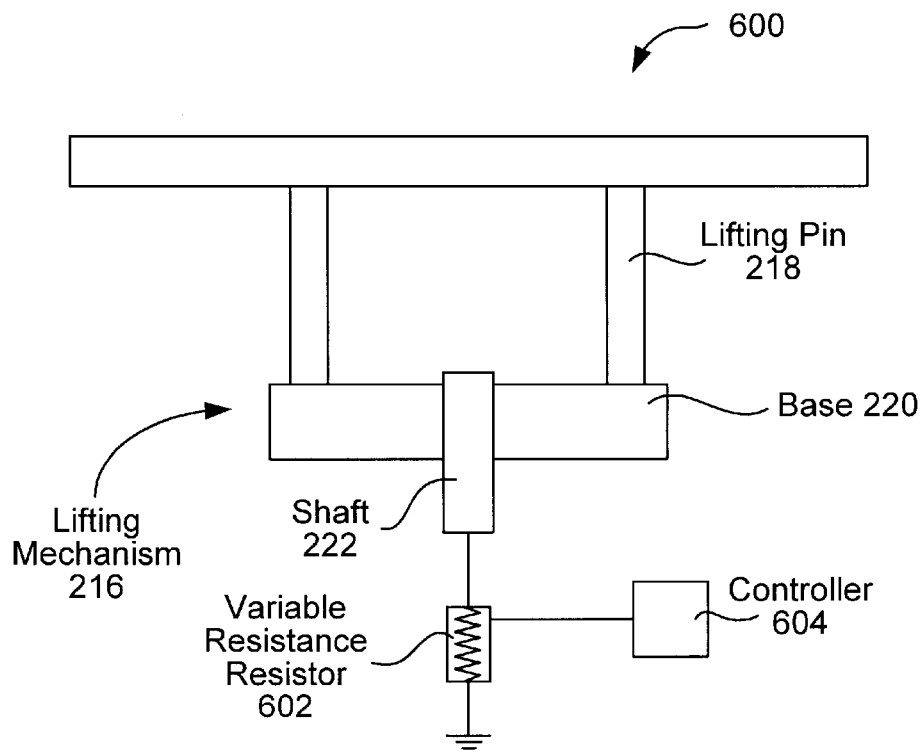
FIG. 6 illustrates a cross-sectional view of a fourth specific embodiment of the substrate lifting arrangement of FIG. 2A.

In a final specific embodiment indicated by reference numeral 600 and illustrated in FIG. 6, all of the components making up the lifting arrangement (indicated by reference numeral 216) are electrically conductive. That is, lifting pins 218 which are supported by lifting pin base 220 which is in turn supported by shaft 222 are all electrically conductive. However, in this embodiment, shaft 222 of the lifting arrangement 216 is not directly connected to ground. Instead, shaft 222 is electrically connected to ground through a variable resistance resistor 602. This arrangement allows the resistance of variable resistance resistor 602 to be changed to suit the specific requirements for the particular substrate being processed in the plasma processing chamber.

In the embodiment illustrated in FIG. 6, the resistance of variable resistance resistor 602 is automatically controlled by a suitable and readily available controller 604. Controller 604 may be programmed to set the resistance of resistor 602 to predetermined resistances based on the process steps used in processing the substrate. This configuration allows the system to automatically change the resistance of resistor 602 to predetermined settings for different substrate process.

Although the substrate lifting arrangement of the above described embodiments has been described as having a specific configuration including four lifting pins, a base, and a shaft which is moved by an actuator, it should be understood that the lifting arrangement may take on a wide variety of specific configurations and still remain within the scope of the invention. In fact, the invention would equally apply to any lifting arrangement configuration that would be capable of lifting the substrate from the chuck while being electrically connected to ground through a predetermined resistance as described above. For example, the lifting arrangement may have any number of lifting pins, or for that matter, may use elements other than lifting pins to engage the substrate. Also, the actuator may take a wide variety of forms so long as the actuator causes the engaging elements of the lifting arrangement to engage and lift the substrate off the chuck.

While this invention has been described in terms of several preferred embodiments, there are alterations, permutations, and equivalents which fall within the scope of this invention. For instance, although the chuck has been described throughout as being an electrostatic chuck, this is not a requirement. Instead, the present invention would equally apply regardless of what particular type of chuck is used. For example, the invention would be equally suitable for discharging any charge remaining on a substrate supported by a mechanical clamping chuck that includes a dielectric layer electrically insulating the substrate from the chuck. It is therefore intended that the following appended claims be interpreted as including all such alterations, permutations, and equivalents as fall within the true spirit and scope of the present invention.

What is claimed is:

1. A substrate lifting arrangement for use in a plasma processing chamber having a chuck configured for supporting a substrate during processing of said substrate within said plasma processing chamber, said substrate lifting arrangement comprising:

at least one substrate element movable between a first position in which said substrate engaging element does not engage said substrate and a second position in which said substrate engaging element engages said substrate and lifts said substrate off said chuck;

an actuator coupled to said substrate engaging element, said actuator controlling movement of said substrate engaging element between said first and second positions; and a resistance arrangement coupled to said substrate engaging element, said resistance arrangement limiting a current flowing from said substrate to ground through said resistance arrangement, said current being caused by remaining electrical charge on said substrate when said substrate is lifted off said chuck by said substrate engaging element;

wherein said chuck is an electrostatic chuck;

said substrate engaging element includes a plurality of electrically conductive lifting pins supported by a dielectric base, said dielectric base being supported on an electrically conductive shaft movable between said first and second positions of said substrate engaging element, said shaft being electrically coupled to said ground; and said resistance arrangement includes a plurality of high voltage component resistors each having a predetermined resistance, each resistor being electrically connected between an associated one of said lifting pins and electrically conductive shaft.

2. The substrate lifting arrangement according to claim 1 wherein said resistance arrangement has a resistance value of about 10 MΩ.

3. A substrate lifting arrangement for use in a plasma processing chamber having a chuck configured for supporting a substrate during processing of said substrate within plasma processing chamber, said substrate lifting arrangement comprising:

at least one substrate engaging element movable between a first position in which said substrate engaging element does not engage said substrate and a second position in which said substrate engaging element engages said substrate and lifts said substrate off said chuck;

an actuator coupled to said substrate engaging element, said actuator controlling movement of said substrate engaging element between said first and second positions; and a resistance arrangement coupled to said substrate engaging element, said resistance arrangement limiting a current flowing from said substrate to ground through said resistance arrangement, said current being caused by remaining electrical charge on said substrate when said substrate is lifted off said chuck by said substrate engaging element;

wherein said chuck is an electrostatic chuck;

said substrate engaging element includes a plurality of electrically conductive lifting pins supported by a dielectric base, said dielectric base being supported on an electrically conductive shaft movable between said first and second positions of said substrate engaging element, said shaft being electrically connected to said ground; and said resistance arrangement includes a layer of material having a predetermined electrical resistance, said layer of material being supported on said dielectric base of said substrate engaging element, said layer of material being electrically coupled between said plurality of electrically conductive lifting pins and said electrically conductive shaft.

4. The substrate lifting arrangement according to claim 3 wherein said resistance arrangement has a resistance value of about 10 MΩ.

5. A substrate lifting arrangement for use in a plasma processing chamber having a chuck configured for supporting a substrate during processing of said substrate within said plasma processing chamber, said substrate lifting arrangement comprising:

at least one substrate engaging element movable between a first position in which said substrate engaging element does not engage said substrate and a second position in which said substrate engaging element engages said substrate and lifts said substrate off said chuck;

an actuator coupled to said substrate engaging element, said actuator controlling movement of said substrate engaging element between said first and second positions; and a resistance arrangement coupled to said substrate engaging element, said resistance arrangement limiting a current flowing from said substrate to ground through said resistance arrangement, said current being caused by remaining electrical charge on said substrate when said substrate is lifted off said chuck by said substrate engaging element;

wherein said chuck is an electrostatic chuck;

said substrate engaging element includes a plurality of electrically conductive lifting pins supported by a base made of a material having a predetermined electrical resistance, said base being supported on an electrically conductive shaft movable between said first and second positions of said substrate engaging element, said shaft being electrically connected to ground, and wherein said combination of said lifting pins, said base, and said shaft comprise said resistance arrangement coupling said substrate to said ground.

6. The substrate lifting arrangement according to claim 5 wherein said resistance arrangement has a resistance value of about 10 MΩ.

7. A substrate lifting arrangement for use in a plasma processing chamber having a chuck configured for supporting a substrate during processing of said substrate within said plasma processing chamber, said substrate lifting arrangement comprising:

at least one substrate engaging element movable between a first position in which said substrate engaging element does not engage said substrate and a second position in which said substrate engaging element engages said substrate and lifts said substrate off said chuck;

an actuator coupled to said substrate engaging element, said actuator controlling movement of said substrate engaging element between said first and second positions; and a resistance arrangement coupled to said substrate engaging element, said resistance arrangement limiting a current flowing from said substrate to ground through said resistance arrangement said current being caused by remaining electrical charge on said substrate wherein said substrate is lifted off said chuck by said substrate engaging element;

wherein said chuck is an electrostatic chuck; and said resistance arrangement includes a variable resistance resistor electrically coupled between said substrate engaging element and said ground.

8. A plasma processing chamber having a chuck configured for supporting a substrate during processing of said substrate within said plasma processing chamber and a substrate lifting arrangement configured for lifting said substrate off said chuck after said processing of said substrate is complete, said substrate lifting arrangement comprising:

first means movable between a first position in which said first means does not engage said substrate and a second position in which said first means engages said substrate and lifts said substrate off said chuck;

actuating means supporting said first means, said actuating means controlling movement of said first means between said first and second positions; and resistance means for limiting a current flowing between said substrate and a ground, said current being caused by a remaining electrical charge on said substrate when said first means engages and lifts said substrate off said chuck;

wherein said resistance means coupling said substrate to said ground is integrally formed as part of said first means and wherein at least a portion of said first means is made of material having a predetermined electrical resistance thereby causing said overall first means to limit said current flow through said first means and wherein said chuck is an electrostatic chuck.

9. The plasma processing chamber according to claim 8 wherein said resistance means has a resistance value of about 10 MΩ.

10. A plasma processing chamber having a chuck configured for supporting a substrate during processing of said substrate within said plasma processing chamber and a substrate lifting arrangement configured for lifting said substrate off said chuck after said processing of said substrate id complete, said substrate lifting arrangement comprising:

first means movable between a first position in which said first means does not engage said substrate and a second position in which said first means engages said substrate and lifts said substrate off said chuck;

actuating means supporting said first means, said actuating means controlling movement of said first means between said first and second positions; and resistance means for limiting a current flowing between said substrate and a ground, said current being caused by a remaining electrical charge on said substrate when said first means engages and lifts said substrate off said chuck;

wherein said resistance means includes a variable resistance resistor electrically connected between said first means and said ground and wherein said chuck is an electrostatic chuck.

11. In a plasma processing chamber having a chuck configured for supporting a substrate during processing of said substrate, a method for discharging an electrical charge remaining on said substrate after said processing of said substrate within said processing chamber, said method comprising:

providing a substrate lifting arrangement, said substrate lifting arrangement being configured for lifting said substrate off said chuck;

electrically coupling said substrate lifting arrangement to a resistance arrangement; and electrically coupling said resistance arrangement to ground, wherein said resistance arrangement is configured to limit a current flow through said substrate lifting arrangement caused by any remaining electrical charge on said substrate as said substrate is lifted off said chuck by said substrate lifting arrangement, wherein said chuck is an electrostatic chuck, providing said substrate lifting arrangement includes:
  providing at least one substrate engaging element movable between a first position in which said substrate engaging element does not engage said substrate and a second position in which said substrate engaging element engages said substrate for lifting said substrate off said chuck; and
  coupling an actuator to said substrate engaging element, said actuator controlling a movement of said substrate engaging element between said first and second positions, said resistance arrangement is integrally formed as part of said substrate engaging element, and at least a portion of said substrate engaging element is made of material having a predetermined electrical resistance, thereby permitting said overall substrate engaging element to limit said current flow between said substrate and said ground.

12. In a plasma processing chamber having a chuck configured for supporting a substrate during processing of said substrate, a method for discharging an electrical charge remaining on said substrate after said processing of said substrate within said processing chamber, said method comprising:

providing a substrate lifting arrangement said substrate lifting arrangement being configured for lifting said substrate off said chuck;

electrically coupling said substrate lifting arrangement to a resistance arrangement; and electrically coupling said resistance arrangement to ground wherein said resistance arrangement is configured to limit a current flow through said substrate lifting arrangement caused by any remaining electrical charge on said substrate as said substrate is lifted off said chuck by said substrate lifting arrangement, wherein said chuck is an electrostatic chuck, providing said substrate lifting arrangement includes:
  providing at least one substrate engaging element movable between a first position in which said substrate engaging element does not engage said substrate and a second position in which said substrate engaging element engages said substrate for lifting said substrate off said chuck; and
  coupling an actuator to said substrate engaging element, said actuator controlling a movement of said substrate engaging element between said first and second positions, and said providing said resistance arrangement includes providing a variable resistance resistor.

13. In a plasma processing chamber having a chuck configured for supporting a substrate during processing of said substrate, a method for manufacturing a semiconductor device out of said substrate, including discharging an electrical charge remaining on said substrate after said processing of said substrate within said processing chamber, said method comprising:

providing a substrate lifting arrangement, said substrate lifting arrangement being configured for lifting said substrate off said chuck;

electrically coupling said substrate lifting arrangement to a resistance arrangement; and electrically coupling said resistance arrangement to ground, wherein said resistance arrangement is configured to limit a current flow through said substrate lifting arrangement caused by any remaining electrical charge on said substrate as said substrate is lifted off said chuck by said substrate lifting arrangement, wherein said providing said substrate lifting arrangement includes:
  providing at least one substrate engaging element movable between a first position in which said substrate engaging element does not engage said substrate and a second position in which said substrate engaging element engages said substrate for lifting said substrate off said chuck; and
  coupling an actuator to said substrate engaging element, said actuator controlling a movement of said substrate engaging element between said first and second positions, said resistance arrangement is integrally formed as part of said substrate engaging element and, and at least a portion of said substrate engaging element is made of material having a predetermined electrical resistance, thereby permitting said overall substrate engaging element to limit said current flow between said substrate and said ground.

14. In a plasma processing chamber having a chuck configured for supporting a substrate during processing of said substrate, a method for manufacturing a semiconductor device out of said substrate, including discharging an electrical charge remaining on said substrate after said processing of said substrate within said processing chamber, said method comprising:

providing a substrate lifting arrangement, said substrate lifting arrangement being configured for lifting said substrate off said chuck;

electrically coupling said substrate lifting arrangement to a resistance arrangement; and electrically coupling said resistance arrangement to ground, wherein said resistance arrangement is configured to limit a current flow through said substrate lifting arrangement caused by any remaining electrical charge on said substrate as said substrate is lifted off said chuck by said substrate lifting arrangement, wherein said providing said substrate lifting arrangement includes:
  providing at least one substrate engaging element movable between a first position in which said substrate engaging element does not engage said substrate and a second position in which said substrate engaging element engages said substrate for lifting said substrate off said chuck; and
  coupling an actuator to said substrate engaging element, said actuator controlling a movement of said substrate engaging element between said first and second positions, and said providing said resistance arrangement includes providing a variable resistance resistor.

\* \* \* \* \*